United States Patent
Park et al.

(10) Patent No.: US 7,471,604 B2
(45) Date of Patent: Dec. 30, 2008

(54) APPARATUS FOR DETECTING AND CORRECTING WOBBLE ERROR AND PHASE LOCKED LOOP CIRCUIT USING THE SAME

(75) Inventors: Hyun-soo Park, Seoul (KR); Jae-seong Shim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 869 days.

(21) Appl. No.: 10/410,593

(22) Filed: Apr. 10, 2003

(65) Prior Publication Data
US 2003/0218953 A1 Nov. 27, 2003

(30) Foreign Application Priority Data
Apr. 11, 2002 (KR) ............. 10-2002-0019721

(51) Int. Cl.
*G11B 7/004* (2006.01)
(52) U.S. Cl. ................................ 369/53.34
(58) Field of Classification Search ............. 369/44.32, 369/44.35, 47.28, 53.34, 59.12, 47.18
See application file for complete search history.

(56) References Cited

U.S. PATENT DOCUMENTS

| | | | |
|---|---|---|---|
| 6,229,774 B1 * | 5/2001 | Yasuda | 369/47.28 |
| 6,272,089 B1 * | 8/2001 | Kato | 369/53.41 |
| 6,487,149 B1 | 11/2002 | Yokoi et al. | |
| 2002/0018414 A1 | 2/2002 | Asano | |
| 2002/0167874 A1 * | 11/2002 | Hayashi | 369/47.28 |

FOREIGN PATENT DOCUMENTS

| | | |
|---|---|---|
| EP | 0 967 612 A | 12/1999 |
| EP | 1 225 582 A | 7/2002 |
| JP | 01-186012 | 7/1989 |
| JP | 04-153954 | 5/1992 |
| JP | 2000-82212 | 3/2000 |
| JP | 2000-113597 | 4/2000 |
| JP | 2001-319428 | 11/2001 |
| JP | 2003-007004 | 1/2003 |

OTHER PUBLICATIONS

Notice of Allowance dated May 26, 2008 of the Korean Patent Application No. 2002-19721.

* cited by examiner

*Primary Examiner*—Joseph H Feild
*Assistant Examiner*—Nathan Danielsen
(74) *Attorney, Agent, or Firm*—Stein, McEwen & Bui, LLP

(57) ABSTRACT

An apparatus for detecting and correcting an error in a wobble signal, includes a window generator which generates a window signal using a phase locked wobble signal, which is generated in synchronization with a raw wobble signal rwb obtained by binarizing the wobble signal read from an optical recording medium, and a control operation unit which corrects the error in the rwb signal and outputs the corrected rwb signal where the error in the rwb signal is detected in the window signal. Accordingly, the error in the wobble signal can be detected and corrected using the window signal, thereby increasing the performance of an optical recording/reproducing system and improving a phase locked loop (PLL) circuit using the apparatus.

24 Claims, 14 Drawing Sheets

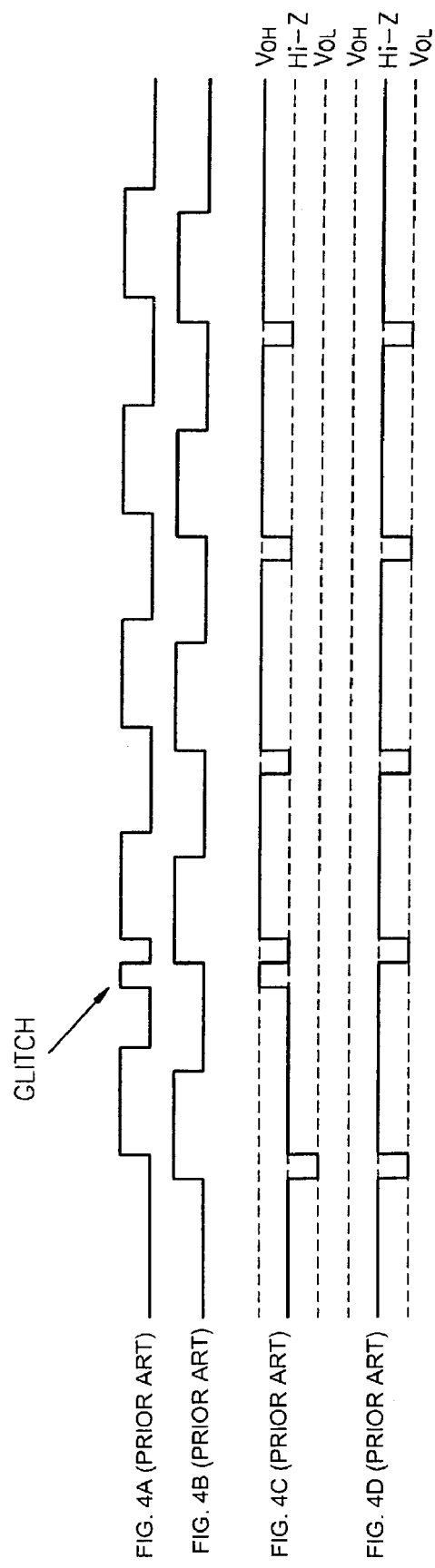

APPARATUS FOR DETECTING AND CORRECTING WOBBLE ERROR AND PHASE LOCKED LOOP CIRCUIT USING THE SAME

CROSS-REFERENCE TO RELATED APPLICATIONS

This application claims the benefit of Korean Patent Application No. 2002-19721, filed Apr. 11, 2002 in the Korean Intellectual Property Office (KIPO), the disclosure of which is incorporated herein by reference.

BACKGROUND OF THE INVENTION

1. Field of the Invention

The present invention relates to a detecting of a wobble signal on an optical recording medium and using the wobble signal to correct an error thereof, and more particularly, to an apparatus which detects an error in a wobble signal on an optical recording medium using a window signal and corrects the wobble error, and a phase locked loop (PLL) circuit using the apparatus.

2. Description of the Related Art

Generally, a phase locked loop (PLL) circuit is used to generate a system clock from a wobble signal when reproducing data on an optical recording medium such as a CD and a DVD-ROM.

Tracks of concentric circles are formed on a surface of a recordable optical recording medium such as a CD-R, a CD-RW, and a DVD-RAM, so as to write data to the surface thereof. To record data at a desired position of the surface of such a disc, it is required to follow a target track of the disc on which data is to be recorded and record the data on the track. To follow the target track, operations to detect a position of a pickup on the disc are needed, and a wobble signal, which is a single frequency signal, is formed on the surface of the disc to be used during the detecting operations.

FIG. 1 shows a partial diagram of tracks of an optical recording medium, i.e., a DVD-RAM. Referring to FIG. 1, wobble signals and a header information signal are recorded along the tracks. A header, in which information regarding the position of the disc is recorded according to predetermined rules, is interleaved with the wobble signals. The position or address of the disc can be detected using the information recorded in the header.

FIG. 2 shows a block diagram of a conventional system clock generator which generates a clock signal using a wobble signal on the optical recording medium shown in FIG. 1. The system clock generator includes a preprocessor 200, a phase frequency detector (PFD) 210, a loop filter 220, a voltage controlled oscillator (VCO) 230, and a frequency divider 240.

The preprocessor 200 reads the wobble signal from the optical recording medium 20 using an optical pickup (not shown), binarizes the wobble signal, and outputs the binarized wobble signal as a raw wobble signal (rwb).

The PFD 210 compares the binarized wobble signal output from the preprocessor 200 with a phase locked wobble signal and outputs a difference therebetween.

The loop filter 220 filters an output of the PFD 210 to output a stable control voltage signal.

The VCO 230 generates an oscillation signal of frequency that is proportional to that of the voltage signal output from the loop filter 220 and outputs the oscillation signal. The oscillation signal acts as a system clock signal.

The frequency divider 240 divides a frequency of the system clock signal output from the VCO 230 to a predetermined frequency of the system clock signal and outputs the result as a phase locked wobble signal (pwb).

The system clock generator of FIG. 2 is a representative example of a PLL circuit that is required to perform writing and reading operations using a wobble signal on an optical recording medium, in synchronization with a binarized rwb signal.

FIGS. 3A-3C are timing diagrams of signals to illustrate an operation of the PFD 210 of FIG. 2. FIGS. 3A and 3B denote a raw wobble signal (rwb) and a phase locked wobble signal (pwb) input to the PFD 210, respectively. FIG. 3C denotes a signal, output from the PFD 210, which is a voltage signal that represents a difference of phase between the signals rwb and pwb.

As shown in FIGS. 3A-3C, the PFD 210 detects rising edges of the signals rwb and pwb and outputs a phase difference between these signals as a voltage signal that changes at three levels: a level of high voltage $V_{OH}$, a level of low voltage $V_{OL}$, and a level of high impedance Hi-Z. In most cases, the PFD 210 operates normally but it may not operate properly due to noise, such as a glitch, input to the PFD 210.

FIGS. 4A-4D are timing diagrams of signals to illustrate a mis-operation of the PFD 210 of FIG. 2. FIGS. 4A and 4B denote an input raw wobble signal (rwb) and an input phase locked wobble signal (pwb), respectively. The rwb signal may include a glitch signal generated due to physical defects of an optical recording medium. FIG. 4C denotes an actual voltage signal output from the PFD 210, which is a measure of the phase difference between the signals rwb and pwb. FIG. 4D denotes a desired signal output from the PFD 210 not in consideration of the glitch in the rwb signal.

Where the PFD 210 malfunctions to output the signal of FIG. 4C due to the glitch contained in the rwb signal, it is impossible to stop the PFD 210 from malfunctioning. The malfunction of the PFD 210 may result in generation of an abnormal system clock and may make it difficult to perform the writing and reading operations on an optical recording medium.

SUMMARY OF THE INVENTION

Accordingly, it is an aspect of the present invention to provide an apparatus which detects and corrects a wobble error using a detection window during a detecting of a wobble on an optical recording medium.

Another aspect of the present invention is to provide a phase locked circuit which generates a system clock that is stable using a wobble corrected through such an apparatus.

Additional aspects and advantages of the invention will be set forth in part in the description which follows and, in part, will be obvious from the description, or may be learned by practice of the invention.

To achieve the above and/or other aspects of the present invention, there is provided an apparatus for detecting and correcting an error in a wobble signal of an optical recording medium, comprising a window generator which generates a window signal using a phase locked wobble signal (pwb), wherein the pwb signal is generated in synchronization with a raw wobble signal (rwb) and the rwb signal is obtained by binarizing the wobble signal read from the optical recording medium, and a control operation unit which corrects an error in the rwb signal and outputs the corrected rwb signal in response to the error in the rwb signal being detected in the window signal.

The window generator may generate a window pulse with a predetermined width at right and left sides of a rising edge of the pwb signal.

The window generator may comprise a right window signal generator which generates a right window pulse with a predetermined right window width at the right side of the rising edge of the pwb signal, a left window signal generator which generates a left window pulse of a predetermined left window width at the left side of the rising edge of the pwb signal, and a window signal combiner which combines the right window pulse and the left window pulse and outputs the combination result.

The right window signal generator may comprise a first comparator which compares a predetermined first window threshold value with a count value obtained by counting the pwb signal in units of system clocks, outputs a level '1' in response to the count value being equal to or less than the predetermined first window threshold value, and outputs a level '0' otherwise, and a first AND operation unit which performs an AND operation on an output of the first comparator and the pwb signal, and outputs the AND operation result.

The left window signal generator may comprise a second comparator which compares a predetermined second window threshold value with a count value obtained by counting the pwb signal in units of system clocks, outputs a level '1' in response to the count value being equal to greater than the predetermined second window threshold value, and outputs a level '0' otherwise, and a second AND operation unit which performs an AND operation on an output of the second comparator and the pwb signal, and outputs the AND operation result.

The apparatus may further comprise a controller which arbitrarily sets or changes the predetermined first window threshold value, the predetermined second window threshold value, or the count value of a cycle of the pwb signal.

The control operation unit may comprise a delay unit which delays the rwb signal and the pwb signal for a predetermined time until the error in the rwb signal is detected and corrected, a lock signal generator which checks whether a phase locked loop (PLL) that is used to generate the pwb signal, operates normally, a selection signal generator which receives a signal indicating whether the PLL is locked from the lock signal generator, checks a presence of a rising edge of the rwb signal in the window signal based on the signal, and generates a control value to correct the error, and a wobble signal selector which selects one of the input rwb signal and the pwb signal in response to the control value output from the selection signal generator.

The control operation unit may further comprise a deglitch circuit which removes a glitch from the rwb signal and outputs the deglitched rwb signal to the delay unit.

The lock signal generator may output a signal indicating a locking of the PLL where the rising edge of the rwb signal is detected in the window signal more than a predetermined number of times in a row, and output a signal indicating an unlocking of the PLL where the rising edge of the rwb signal is not detected more than the predetermined number of times in a row.

The selection signal generator may output a first control value to select the rwb signal where a signal, which indicates an unlocking of the PLL, is output from the lock signal generator, and output a second control value to select the pwb signal where the PLL is locked, but not locked in the window signal. The selection signal generator may output the first control value where the PLL is locked in the window signal and the rising edge of the rwb signal is detected in the window signal, and output the second control value where the PLL is locked in the window signal, but the rising edge of the rwb signal is not detected in the window signal.

The wobble signal selector may output the rwb signal where the first control value is output from the selection signal generator, and output the pwb signal where the second control value is output from the selection signal.

To achieve the above and/or other aspects of the present invention, there is provided a phase locked loop (PLL) circuit that generates system clocks using a wobble signal output from an optical recording medium, the PLL circuit comprising a wobble signal correcting unit which checks whether a raw wobble signal (rwb) is phase locked, corrects the rwb signal, and inputs the corrected rwb signal to a PLL of the circuit, wherein the rwb signal is from the optical recording medium and binarized.

The wobble signal correcting unit may comprise a window generator which generates a detection window using a phase locked wobble signal (pwb), wherein the pwb signal is obtained by phase locking the rwb signal using the PLL, and a control operation unit which corrects an error in the rwb signal and outputs the corrected rwb signal, where the error is detected in the detection window.

The window generator may generate a pulse signal of a predetermined width at right and left sides of a rising edge of the pwb signal.

The window generator may comprise a right window signal generator which generates a right pulse signal of a predetermined right pulse width at the right side of the rising edge of the pwb signal, a left window signal generator which generates a left pulse signal of a predetermined left pulse width at the left side of the rising edge of the pwb signal, and a window signal combiner which combines the right pulse signal and the left pulse signal and outputs the combination result.

The right window signal generator may comprise a first comparator which compares a predetermined first window threshold value with a count value obtained by counting the pwb signal in units of system clocks, outputs a level '1' in response to the count value being equal to or less than the predetermined first window threshold value, and outputs a level '0' otherwise, and a first AND operation unit which performs an AND operation on an output of the first comparator and the pwb signal, and outputs the AND operation result.

The left window signal generator may comprise a second comparator which compares a predetermined second window threshold value with a count value obtained by counting the pwb signal in units of system clocks, outputs a level '1' in response to the count value being equal to greater than the predetermined second window threshold value, and outputs a level '0' otherwise, and a second AND operation unit which performs an AND operation on an output of the second comparator and the pwb signal, and outputs the AND operation result.

The PLL circuit may further include a controller which arbitrarily sets or changes the predetermined first window threshold value, the predetermined second threshold value, or the count value of a cycle of the pwb signal.

The control operation unit may comprise a delay unit which delays the rwb and pwb signals for a predetermined time until the error in the rwb signal is detected and corrected a lock signal generator which checks whether the PLL operates normally a selection signal generator which receives a signal indicating whether the PLL is locked from the lock signal generator, checks a presence of a rising edge of the rwb signal in the detection window based on the signal, and generates a control value to correct the error, and a wobble signal selector which selects one of the input rwb signal and the pwb signal in response to the control value output from the selection signal generator.

The control operation unit may further comprise a deglitch circuit which removes a glitch from the rwb signal and outputs the deglitched rwb signal to the delay unit.

The lock signal generator may output a signal indicating a locking of the PLL where the rising edge of the rwb signal is detected in the detection window more than a predetermined number of times in a row, and output a signal indicating an unlocking of the PLL where the rising edge of the rwb signal is not detected more than the predetermined number of times in a row.

The selection signal generator may output a first control value to select the rwb signal where a signal, which indicates an unlocking of the PLL, is output from the lock signal generator, and output a second control signal to select the pwb signal were the PLL is locked, but not locked in the detection window. The selection signal generator may output the first control vale where the PLL is locked in the detection window and the rising edge of the rwb signal is detected in the detection window, and output the second control value where the PLL is clocked in the detection window, but the rising edge of the rwb signal is not detected in the detection window.

The wobble signal selector may output the rwb signal in response to the first control value being generated from the selection signal generator, and output the pwb signal in response to the second control value being generated from the selection signal generator.

To achieve the above and/or other aspects of the present invention, there is provided a phase locked loop (PLL) circuit that generates system clocks using a wobble signal output from an optical recording medium, comprising a preprocessor which reads the wobble signal output from the optical recording medium, binarizes the wobble signal, and outputs the binarized wobble signal as a raw wobble signal (rwb), a wobble error detecting and correcting unit which detects an error in the rwb signal and outputs a phase locked signal (pwb) instead of the rwb signal where the error in the rwb signal is detected, wherein the pwb signal is in phase with the rwb signal, a phase comparator which compares a phase of the corrected rwb signal output from the wobble error detecting and correcting unit with that of the pwb signal, and outputs a voltage signal corresponding to a difference between the corrected rwb signal and the pwb signal, a voltage-controlled oscillator which converts the voltage signal output from the phase comparator into a system clock signal of predetermined frequency and outputs the system clock signal, and a frequency divider which divides the frequency of the system clock signal to follow the rwb signal and outputs the result as the pwb signal.

The wobble error detecting and correcting unit may comprise a window generator which generates a window using the pwb signal obtained by phase locking the rwb signal through a PLL of the circuit, and a control operation unit which corrects the error in the rwb signal and outputs the corrected rwb signal where the error in the signal rwb is detected in the window.

The window generator may generate a pulse signal of predetermined width at right and left sides of a rising edge of the pwb signal.

The window generator may comprise a right window signal generator which generates a right pulse signal of a predetermined right pulse width at the right side of the rising edge of the pwb signal, a left window signal generator which generates a left pulse signal of a predetermined left pulse width at the left side of the rising edge of the pwb signal, and a window signal combiner which combines the right and left pulse signals at the right and left sides of the rising edge and outputs the combination result.

The right window signal generator may comprise a first comparator which compares a predetermined first window threshold value with a count value obtained by counting the pwb signal in units of system clocks, outputs a level '1' in response to the count value being equal to or less than the predetermined first window threshold value, and outputs a level '0' otherwise, and a first AND operation unit which performs an AND operation on an output of the first comparator and the pwb signal, and outputs the AND operation result.

The left window signal generator may comprise a second comparator which compares a predetermined second window threshold value with a count value obtained by counting the pwb signal in units of system clocks, outputs a level '1' in response to the count value being equal to or greater than the predetermined second window threshold value, and outputs a level '0' otherwise, and a second AND operation unit which performs an AND operation on an output of the second comparator and the pwb signal, and outputs the AND operation result.

The PLL circuit may further include a controller which arbitrarily sets or changes the predetermined first window threshold value, the predetermined second window threshold value, or the count value of a cycle of the pwb signal.

The control operation unit may comprise a delay unit which delays the rwb signal and the pwb signal for a predetermined time until the error in the rwb signal is detected and corrected a lock signal generator which checks whether the PLL operates normally a selection signal generator which receives a signal indicating whether the PLL is locked from the lock signal generator, checks a presence of a rising edge of the rwb signal in the window based on the signal, and generates a control value to correct the error, and a wobble signal selector which selects one of the input rwb signal and the pwb signal in response to the control value output from the selection signal generator.

The control operation unit may further comprise a deglitch circuit which removes a glitch from the rwb signal and outputs the deglitched rwb signal to the delay unit.

The lock signal generator may output a signal indicating a locking of the PLL where the rising edge of the rwb signal is detected in the window more than a predetermined number of times in a row, and outputs a signal indicating an unlocking of the PLL where the rising edge of the rwb signal is not detected more than the predetermined number of times in a row.

The selection signal generator may output a first control value to select the rwb signal where a signal, which indicates an unlocking of the PLL, is output from the lock signal generator, and output a second control value to select the pwb signal where the PLL is locked, but not locked in the window. The selection signal generator may output the first control value where the PLL is locked in the window and the rising edge of the rwb signal is detected in the window, and output the second control value where the PLL is locked in the window, but the rising edge of the rwb signal is not detected in the window.

The wobble signal selector may output the rwb signal in response to the first control value being output from the selection signal generator, and outputs the pwb signal in response to the second control value being output from the selection signal generator.

BRIEF DESCRIPTION OF THE DRAWINGS

These and/or other aspects and advantages of the present invention will become apparent and more readily appreciated from the following description of the embodiments, taken in conjunction with the accompanying drawings of which:

FIGS. 4A-4D are timing diagrams of signals to illustrate a mis-operation of the phase frequency detector of FIG. 2;

DETAILED DESCRIPTION OF THE PREFERRED EMBODIMENTS

Figure 1:
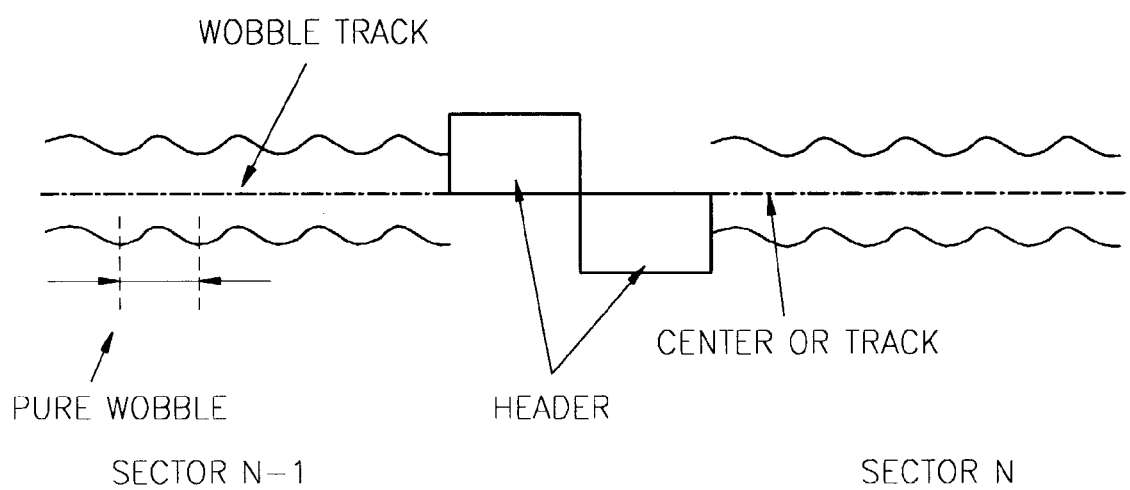
FIG. 1 is a partial diagram of a DVD-RAM which is an optical recording medium.
Figure 2:
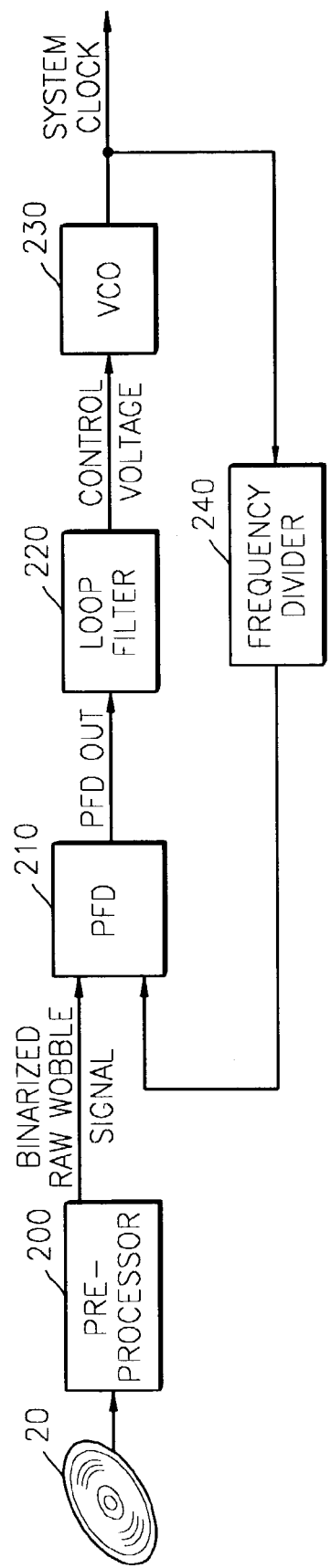
FIG. 2 is a block diagram of a conventional system clock generator that generates a clock signal using a wobble signal on the optical recording medium of FIG. 1.
Figures 3A, 3B, 3C:
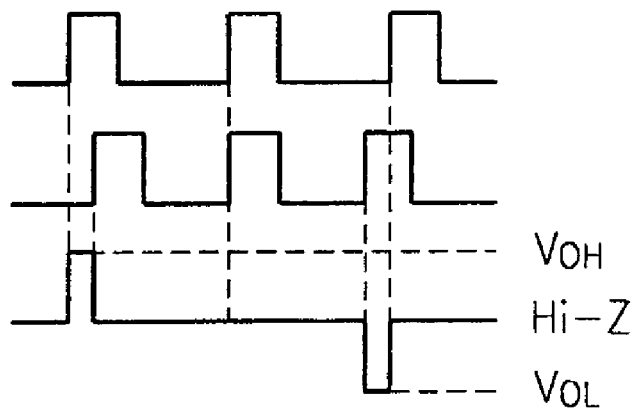
FIGS. 3A-3C are timing diagrams of signals to illustrate an operation of a phase frequency detector of FIG. 2.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 5:
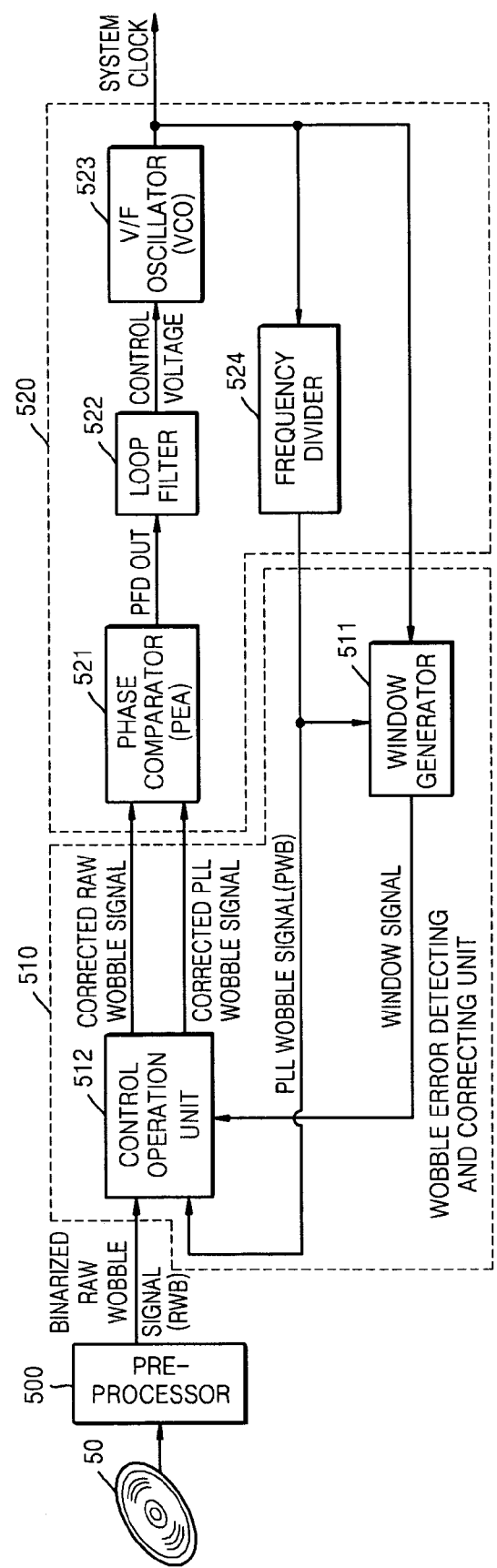
FIG. 5 is a block diagram of a system clock generator which prevents a fault in a wobble signal, according to an embodiment of the present invention.

FIG. 5 shows a system clock generator having a function to prevent a fault of a wobble, according to an embodiment of the present invention. Referring to FIG. 5, the system clock generator includes a preprocessor 500, a wobble error detecting and correcting unit 510, and a phase locked circuit 520.

The preprocessor 500 reads a wobble signal recorded on an optical recording medium 50, for example, a DVD, and binarizes the read wobble signal. The binarized wobble signal will be referred to as a 'raw wobble signal rwb' in this disclosure. The rwb signal may contain an error generated due to physical defects of the optical recording medium 50 or a channel interference during a reading operation of the optical recording medium 50.

The wobble error detecting and correcting unit 510 detects the error in the rwb signal and outputs a phase locked wobble signal pwb, i.e., a phase locked signal, that is in phase with the rwb signal and does not contain an error. The error in the rwb signal is detected by a window generator 511. The window generator 511 generates window signals of predetermined widths at right and left sides of the pwb signal made from the rwb signal, in synchronization with a rising edge of the pwb signal. A control operation unit 512 detects the error in the rwb signal and outputs an error correction signal, using the window signal. That is, the control operation unit 512 checks whether an error is contained in the rwb signal using the window signal, corrects the rwb signal at a corresponding instant of time of which the error is detected, and outputs the corrected signal. The rwb signal may be corrected using various ways. However, the rwb signal containing the error is corrected by outputting the pwb signal instead of the rwb signal, according to an embodiment of the present invention. This method will be described in detail below.

The PLL circuit 520 includes a phase comparator 521 which compares the phase of the corrected rwb signal with that of the pwb signal output from the wobble error detecting and correcting unit 510, and outputs a voltage signal corresponding to a phase difference between these signals. The output voltage signal passes through a loop filter 522 to be stabilized. Also, the stabilized voltage signal is input to a voltage controlled oscillator (VCO) 523 and output as a system clock signal with a predetermined frequency. A frequency divider 524 divides the system clock signal to follow the rwb signal and outputs the result as the pwb signal. In conclusion, the system clock and the pwb signal are generated from the rwb signal from which an error, such as a glitch, is removed, and thus, the system clock and the pwb signal are stably output. The system clock and the pwb signal output from the PLL circuit 520 are used to generate the window signal and the corrected rwb signal in the wobble error detecting and correcting unit 510.

Figure 6A:
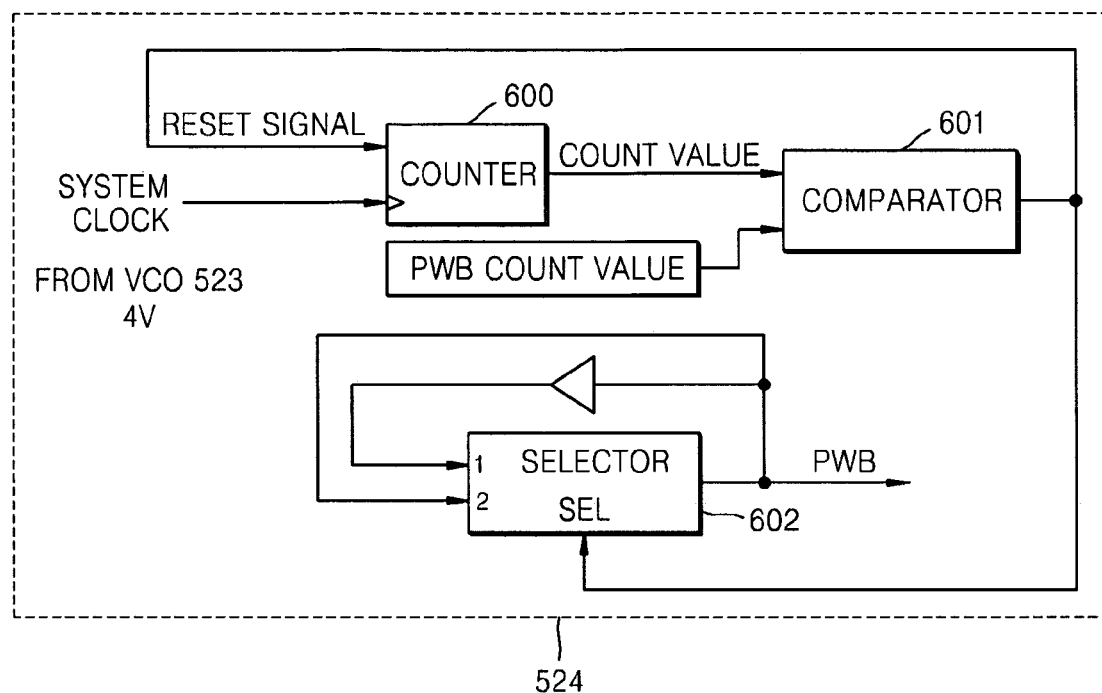
FIG. 6A is a circuit diagram of a frequency divider of FIG. 5.
Figure 6B:
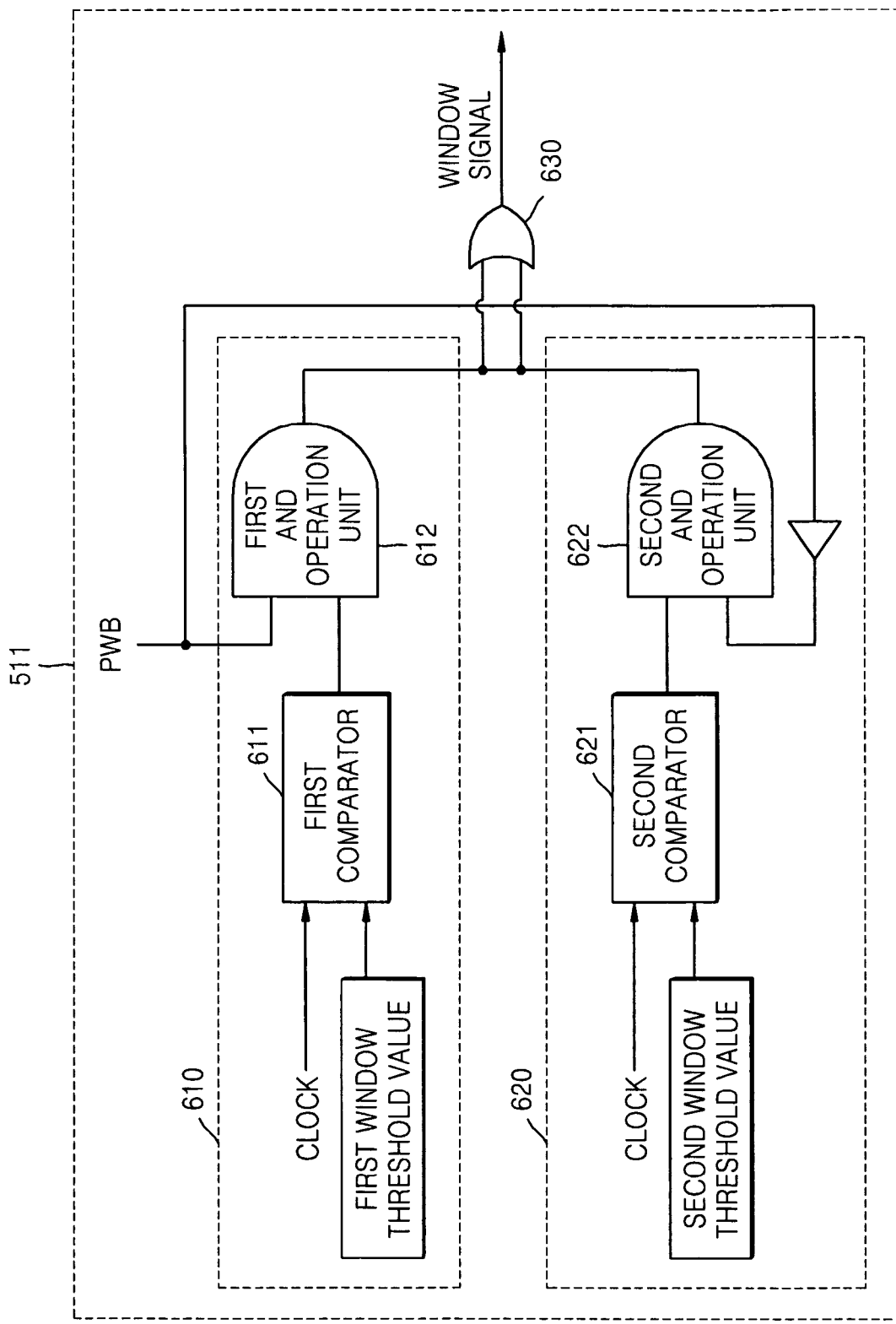
FIG. 6B is a circuit diagram of a window generator of FIG. 5.

FIGS. 6A and 6B illustrate the frequency divider 524 and the window generator 511 shown in FIG. 5, respectively.

Referring to FIG. 6A, the frequency divider 524 includes a counter 600, a comparator 601, and a selector 602. The counter 600 performs counting operations whenever a system clock is input to the counter 600, and is reset in response to a reset signal.

The comparator 601 compares a count value output from the counter 600 with a predetermined count value of a desirable pwb signal. The comparator 601 outputs a first signal where the counter value is the same as the predetermined count value, and outputs a second signal where these values are different from each other. In the case of a DVD, 186 system clocks may be included within a preferable wobble period. In this case, the preferable count value of the pwb signal is set to be 92 because there are 93 clocks (counting begins with 0). Where an output of the counter 600 is 92, the comparator 601 outputs the first signal corresponding to the reset signal. The first signal is input to the counter 600 and resets the counter value to be 0.

In the selector 602, a signal output from the selector 602 is inverted and set to be a first input, and the signal output form the selector 602 is set to be a second input. In response to a selection signal sel, one of the first and second inputs is selected. That is, the selector 602 selects and outputs the first input which is an inversion of a previous output signal where an output of the comparator 601 is the reset signal, i.e., the first signal. Otherwise, the selector 602 selects and outputs the second input that is a present input. In the case of a DVD, the level of a signal is inverted whenever 93 clocks are counted. Thus, during the counting of 186 clocks, a desirable pwb signal having two levels of signal can be generated.

The window generator 511 of FIG. 6B includes a right window signal generator 610, a left window signal generator 620, and a window signal combiner 630.

The right window signal generator 610 includes a first comparator 611 and a first AND operation unit 612. An output of the counter 600 of FIG. 6A and a predetermined first window threshold value, which is predetermined in consideration of a width of a window, are input to the first comparator 611. An output of the first comparator 611 is 1 only where the output of the counter 600 is equal to or less than the first window threshold value. Otherwise, the output of the first comparator 611 is 0. For instance, the output of the first comparator 611 is a level '1' where the first window threshold value is 4 and the outputs of the counter 600 are 0, 1, 2, 3, and 4. Otherwise, the output of the first comparator 611 is 0. The first AND operation unit 612 performs an AND operation on the output of the first comparator 611 and the pwb signal of FIG. 6A and outputs the result. The first AND operation unit 612 permits generation of a window signal around a rising edge of the pwb signal, but does not permit generation of the window signal around a falling edge of the pwb signal.

The left window signal generator 620 includes a second comparator 621 and a second AND operation unit 622. An output of the counter 600 and a predetermined second threshold value, which is predetermined in consideration of a width of a window, are input to the second comparator 621. Where the output of the counter 600 is equal to or greater than the second window threshold value, the output of the second comparator 621 is a level '1'. Otherwise, the output of the second comparator 621 is a level '0'. For instance, the output of the second comparator 621 is the level '1' where the second window threshold value is 90 and the outputs of the counter 600 are 90, 91, and 92. Otherwise, the output of the second comparator 621 is the level '0'. The second AND operation unit 622 performs an AND operation on the output of the second comparator 621 and an inversion value of the pwb signal of FIG. 6B and outputs the result. The second AND operation unit 622 permits generation of a window signal around a rising edge of the pwb signal but does not permit generation of the window signal around a falling edge of the pwb signal.

The window signal combiner 630 combines an output of the right window signal generator 610 and an output of the left window signal generator 620, and outputs the combination result. The window signal combiner 630 may be an OR operation unit. That is, an OR operation is performed on the signal output from the right window signal generator 610 and the signal output from the left window signal generator 620, and as a result, the right window and left signals are combined with each other.

The count value for a period of the pwb signal, as well as first and second window threshold values, may be arbitrarily set or changed using a controller such as a MICOM (not shown). According to the present invention, a window signal of a predetermined width is formed around a rising edge of the pwb signal in order to use the window signal to detect an error in a wobble signal. To generate the window signal, count values can be appropriately set at right and left sides of the rising edge of the pwb signal, which is counted from 0, in consideration of a predetermined width of the window signal. The set count values are, for example, the first and second window threshold values.

Figure 7:
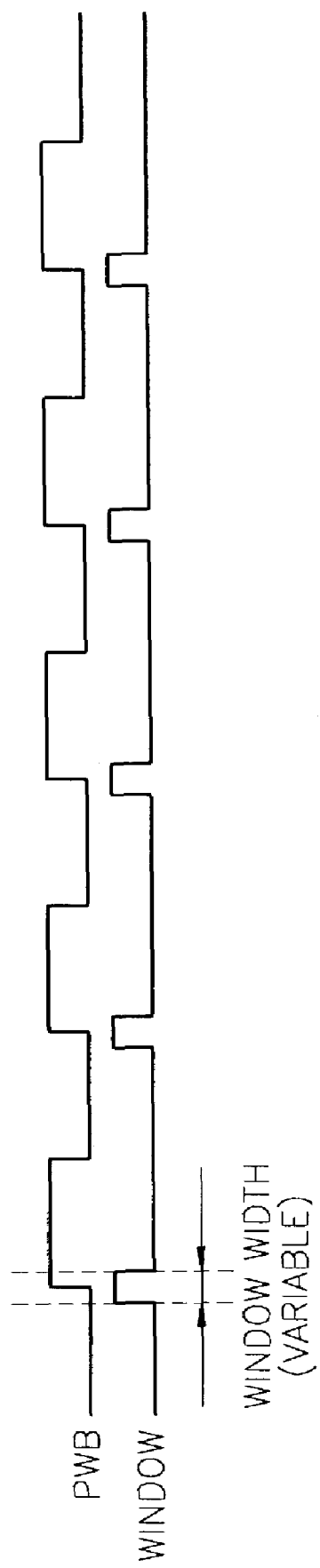
FIG. 7 is a diagram of waveforms to illustrate a phase locked wobble signal pwb and a window signal that is generated from the signal pwb using the window generator of FIG. 6B.
Figure 8:
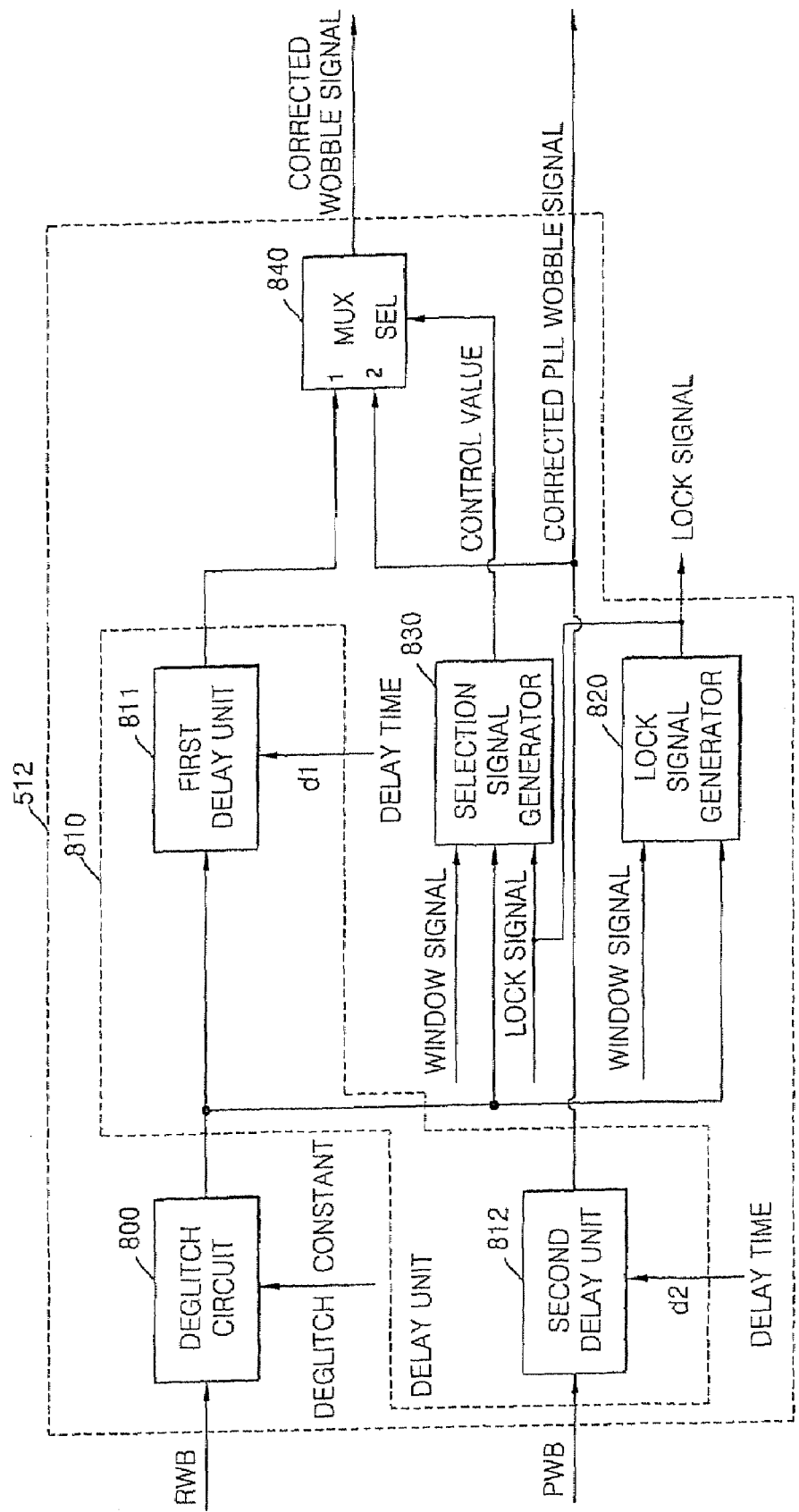
FIG. 8 is a block diagram of a control operation unit that detects an error in a raw wobble signal rwb of FIG. 5.

FIG. 7 shows waveforms to illustrate the window signal generated by the window generator 511 shown in FIG. 6B. FIG. 8 shows a block diagram of the control operation unit 512 of FIG. 5 that detects and corrects an error in the rwb signal.

Referring to FIG. 8, the control operation unit 512 includes a delay unit 810, a lock signal generator 820, a selection signal generator 830, and a wobble signal selector 840.

The rwb signal, which is obtained by binarizing a wobble signal read from the optical recording medium 50, is input to a deglitch circuit 800 to remove noise contained in the rwb signal. The deglitch circuit 800 is capable of removing a pulse signal of a very short period, which is contained in the rwb signal, but inclusion of the deglitch circuit 800 into the control operation unit 512 is optional. A glitch removal constant of the deglitch circuit 800 may be arbitrarily set or changed using a controller such as a MICOM (not shown).

The delay unit 810 delays the rwb signal and the pwb signal for a predetermined time. For the delay of these signals, a first delay circuit 811 and a second delay circuit 812 are used. The rwb and pwb signals must be delayed for the predetermined time, because an error contained in the rwb signal is checked after the input of the rwb signal, which may contain the error (the detection of the error in the signal rwb will be later explained), and the rwb signal may be processed to be output without being corrected before the detection of the error. That is, the input rwb and pwb signals are delayed until the detection of an error in the rwb signal, so as to remove the detected error using the input pwb signal after the error is detected.

The lock signal generator 820 checks whether a phase locked loop (PLL) operates normally. Where the PLL operates normally, a rising edge of the rwb signal must be detected from a window signal generated by the window generator 511. Where rising edges of the rwb signal are continuously detected from the window signal for a predetermined times, the lock signal generator 820 outputs a signal indicating a locking of the PLL. Otherwise, the lock signal generator 820 outputs a signal indicating an unlocking of the PLL.

The selection signal generator 830 receives a lock signal, which indicates whether the PLL is locked, from the lock signal generator 820, checks whether the rising edge of the rwb signal is detected from the window signal so as to determine whether an error is contained in the rwb signal, and generates a control value to correct the error in the rwb signal. In other words, the selection signal generator 830 generates a first control value to select the rwb signal where the PLL is not locked, and generates a second control value to select the pwb signal in sections, except for sections of the window signal, where the PLL is locked. While the PLL is locked, the selection signal generator 830 outputs the first control value to select the rwb signal where the rising edge of the rwb signal is detected in the window signal, and outputs the second control value to select the pwb signal where the rising edge is not detected in the window signal.

Meanwhile, the selection signal generator 830 outputs the first control value since the rwb signal has to be input to the PLL circuit 520 until the signals rwb and pwb are almost in phase where the PLL is not locked. Where the PLL is locked, it can be understood that the signals rwb and pwb are almost in phase, and thus, where an error is detected from the rwb signal, the stable pwb signal, instead of the rwb signal, can be output. Accordingly, the error in the rwb signal is detected using the window signal, and the first or second control value to select the rwb signal or the pwb signal is generated.

The wobble signal generator 840 selects and outputs one of the rwb and pwb signals in response to the first or second control value output from the selection signal generator 830. The output of the rwb signal corresponds to a case where the stable pwb signal is not yet output since the PLL is not locked, or an error is not detected from the rwb signal after the locking of the rwb signal. The output of the pwb signal corresponds to a case where an error is detected from the rwb signal after the locking of the rwb signal.

Figure 9:
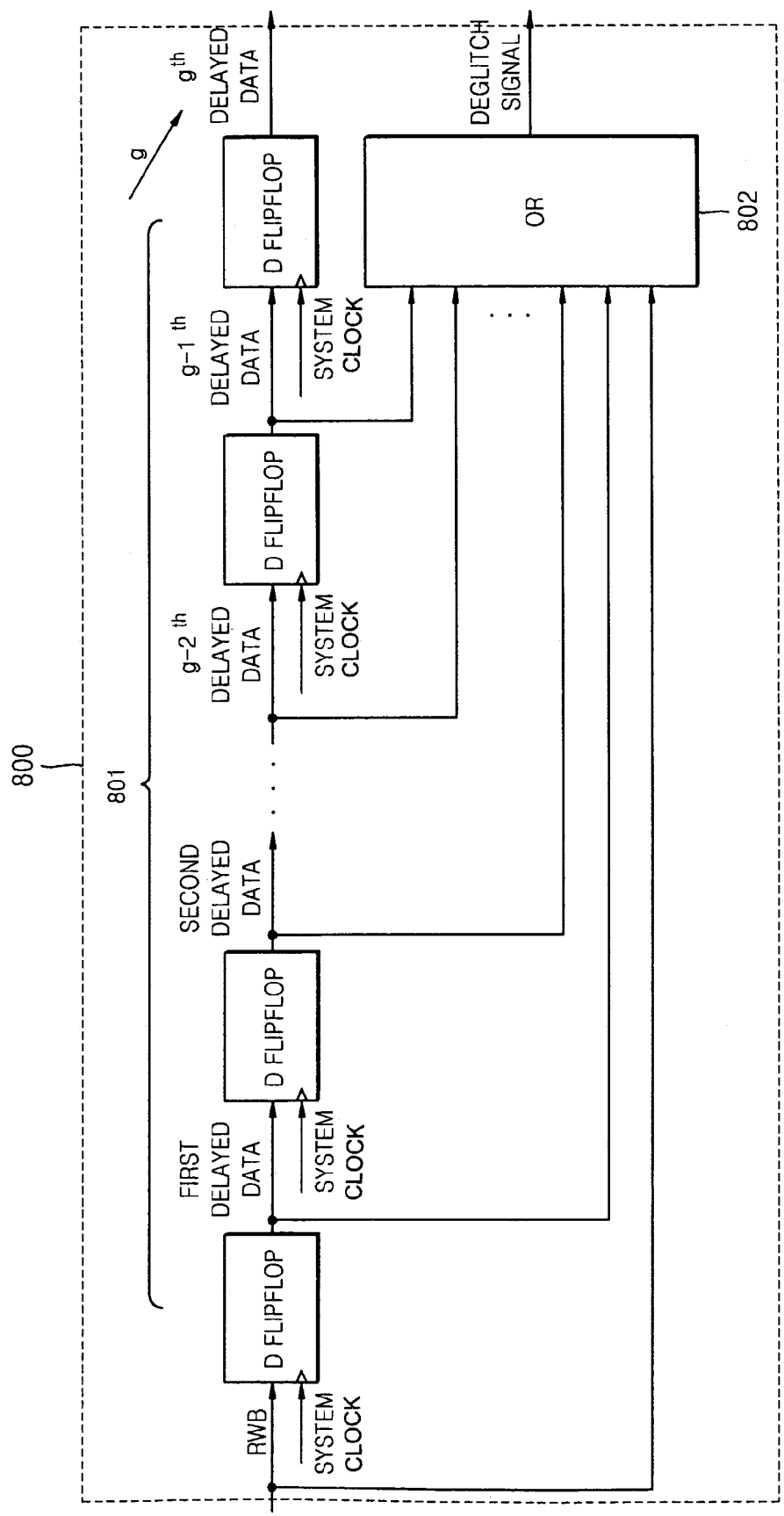
FIG. 9 is a block diagram of a deglitch circuit of FIG. 8 according to the present invention.

FIG. 9 shows an example of the deglitch circuit 800 of FIG. 8, according to the present invention. The deglitch circuit of FIG. 9 includes predetermined numbers of delay circuits 801 and an OR circuit 802. The deglitch circuit of FIG. 9 delays the output of an input rwb signal containing a glitch at predetermined intervals of time, combines signals output from each of the delay circuits 801, and outputs the combination result, so as to remove the glitch. The glitch circuit delays the output of the rwb signal in units of system clocks. A glitch removal constant (delay time: g) may be arbitrarily set or changed using a controller such as a microcomputer (not shown).

Figure 10:
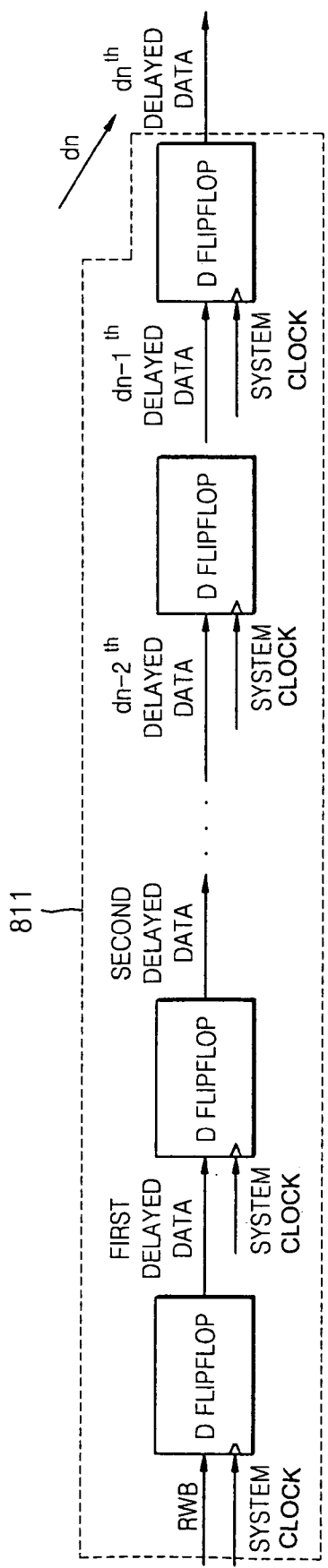
FIG. 10 is a block diagram of a delay unit of FIG. 8 according to the present invention.

FIG. 10 shows an example of the delay unit 810 of FIG. 8, according to the present invention. Referring to FIG. 10, the delay unit 810 serially connects delay circuits, for example, D flip-flops circuits and delays an input rwb signal, whenever a system clock is input. A delay constant, i.e., the number of delay circuits, may be arbitrarily set or changed using a controller such as a microcomputer (not shown).

Figure 11:
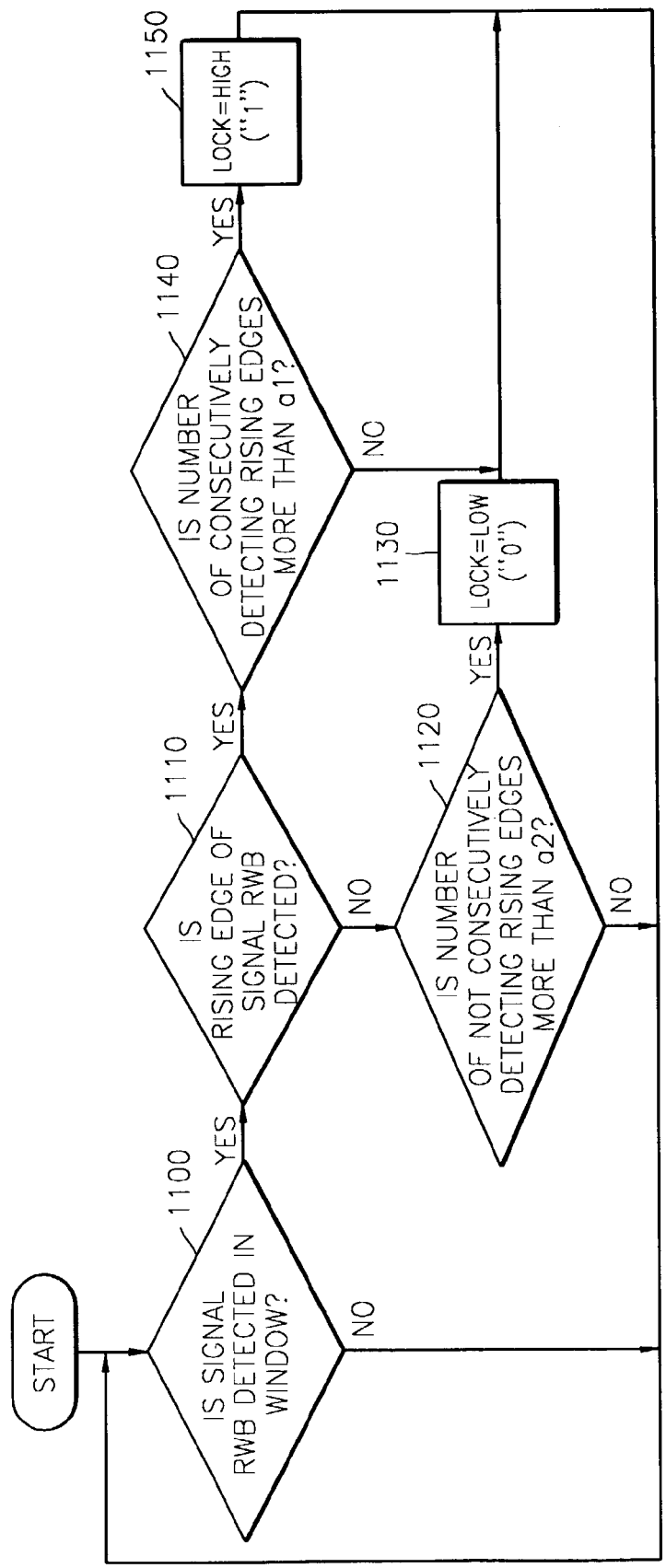
FIG. 11 is a flowchart illustrating an operation of a lock signal generator of FIG. 8.

FIG. 11 shows a flowchart illustrating an operation of the lock signal generator 810 of FIG. 8. Referring to FIG. 11, whether a timing is for a window section is checked from the window signal in operation 1100. Where the rwb signal is detected within the window section, whether a rising edge of the rwb signal is detected in the window section is checked in operation 1110. Where the rising edge of the rwb signal is not detected in the window section, whether the number of not consecutively detecting rising edges is more than a2 is checked in operation 1120. Where the number is more than a2, a signal indicating a PLL unlocking is output, e.g., lock=low, in operation 1130.

Where the rising edges of the rwb signal are detected in the window section, whether the number of consecutively detecting rising edges is more than a1 is checked in operation 1140. In this case, a signal indicating a PLL locking of the rwb signal is output in operation 1150.

The PLL locking indicates that the rwb signal and the pwb signal are in phase, in which whether the pwb signal is in synchronization with the rwb signal is determined using a window signal generated from a rising edge of the pwb signal.

Figure 12:
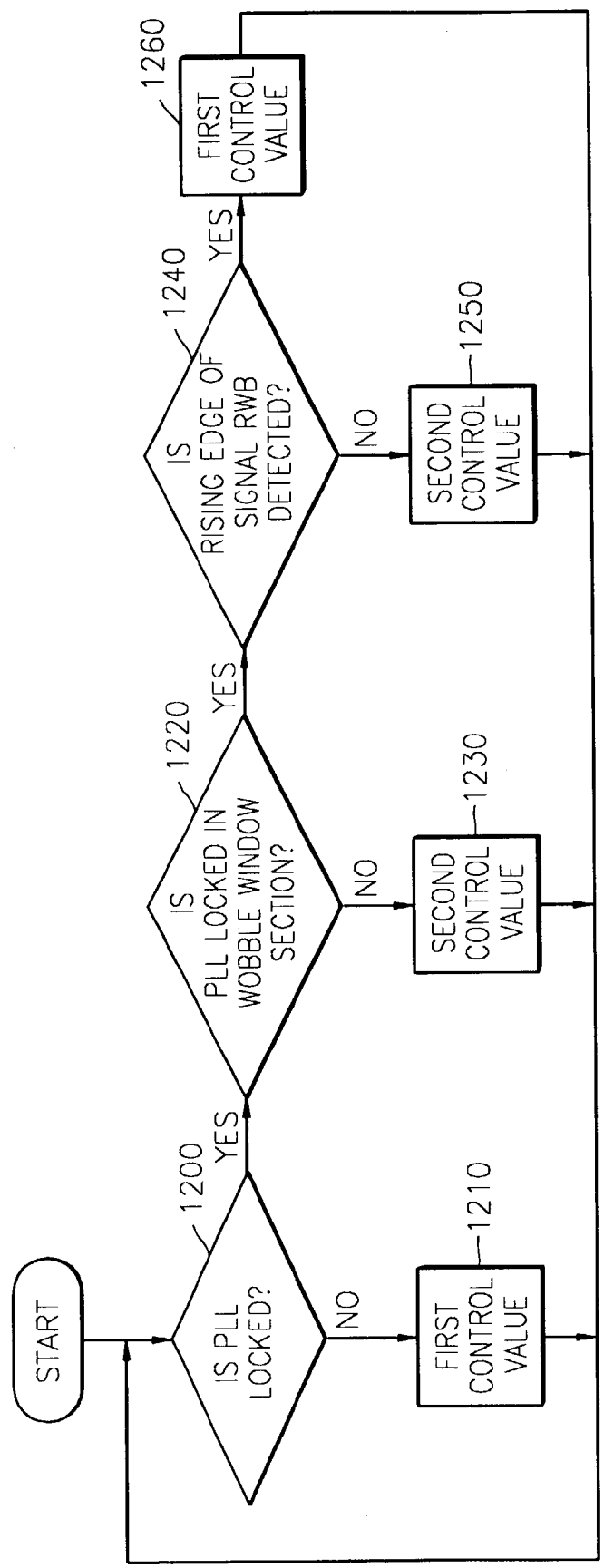
FIG. 12 is a flowchart illustrating an operation of a selection signal generator of FIG. 8.

FIG. 12 shows a flowchart illustrating an operation of the selection signal generator 830 of FIG. 8, according to the present invention. Whether a PLL is locked or not is checked in operation 1200. Where the PLL is not locked, a first control value is output to select the rwb signal until the rwb signal and the pwb signal are in phase, in operation 1210.

Where the PLL is locked, whether the PLL is locked within a wobble window section is checked in operation 1220. Where the PLL is not locked in the wobble window section, a second control value is output to select the signal pwb in operation 1230. Where the PLL is locked in the wobble window section, whether a rising edge of the rwb signal is detected in the wobble window section is checked in operation 1240.

Where the rising edge of the rwb signal is not detected, it is determined that the rwb signal contains an error and the second control value is output to select the pwb signal in operation 1250. Where the rising edge of the rwb signal is detected, it is determined that the rwb signal does not contain an error and the first control value is output to select the rwb signal, in operation 1260.

Figure 13:
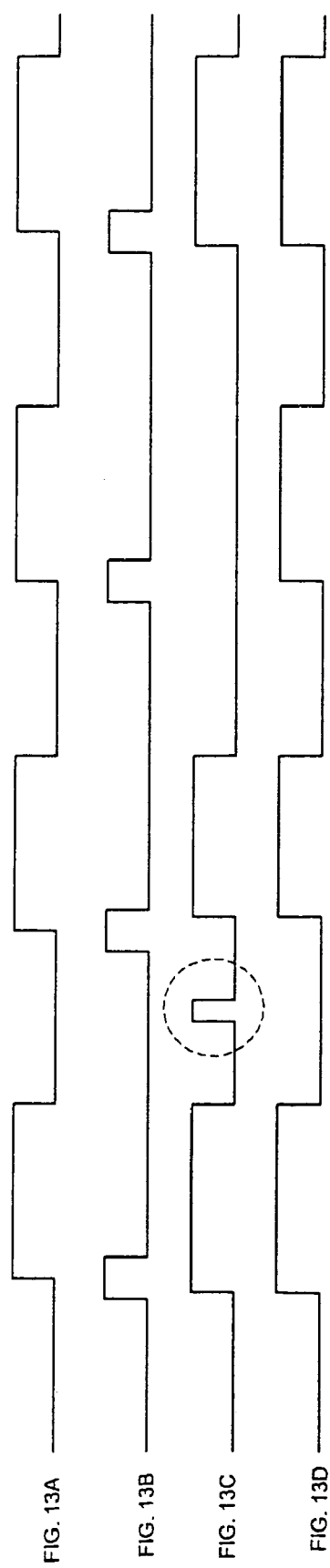
FIGS. 13A-13D are timing diagrams of signals to illustrate a process of correcting a raw wobble signal rwb according to the present invention.

FIGS. 13A-13D show timing diagrams of signals to explain a process of correcting a raw wobble signal rwb according to the present invention. FIG. 13A shows a waveform of the rwb signal that is input to a PLL circuit and stabilized. FIG. 13B shows a waveform of a window signal that is generated at rising edges of a phase locked wobble signal pwb. FIG. 13C shows a waveform of the rwb signal that is obtained by binarizing a wobble signal read from an optical recording medium, and contains a glitch signal. FIG. 13D shows a waveform of a raw wobble signal rwb that is corrected and output according to the present invention.

In an apparatus and method of detecting and correcting a wobble signal containing an error, according to the present invention, the error in the wobble signal can be effectively corrected, thereby stabilizing an optical recording system and increasing the performance of the system.

According to the present invention, an error in a wobble signal is detected using a window signal and a corrected wobble signal is output, thereby increasing the performance of a recording and reproducing system for an optical recording medium.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An apparatus for detecting and correcting an error in a wobble signal of an optical recording medium, comprising:
    a window generator which generates a window signal using a phase locked wobble signal (pwb) of the optical recording medium, wherein:
        the pwb signal is generated in synchronization with a raw wobble signal (rwb), and
        the rwb signal is obtained by binarizing the wobble signal read from the optical recording medium; and
    a control operation unit which corrects an error in the rwb signal and outputs the corrected rwb signal in response to the error in the rwb signal being detected in the window signal.

2. The apparatus of claim 1, wherein the window generator generates a window pulse with a predetermined width at right and left sides of a rising edge of the pwb signal.

3. The apparatus of claim 2, wherein the window generator comprises:
    a right window signal generator which generates a right window pulse with a predetermined right window width at the right side of the rising edge of the pwb signal;
    a left window signal generator which generates a left window pulse with a predetermined left window width at the left side of the rising edge of the pwb signal; and
    a window signal combiner which combines the right window pulse and the left window pulse and outputs the combination result.

4. The apparatus of claim 3, wherein the right window signal generator comprises:
    a first comparator which compares a predetermined first window threshold value with a count value obtained by counting the pwb signal in units of system clocks, outputs a level '1' in response to the count value being equal to or less than the predetermined first window threshold value, and outputs a level '0' otherwise; and
    a first AND operation unit which performs an AND operation on an output of the first comparator and the pwb signal, and outputs the AND operation result.

5. The apparatus of claim 4, further comprising a controller which arbitrarily sets or changes the predetermined first window threshold value, or the count value of a cycle of the pwb signal.

6. The apparatus of claim 4, wherein the predetermined first window threshold value is determined in consideration of a width of the window signal.

7. The apparatus of claim 3, wherein the left window signal generator comprises:
    a second comparator which compares a predetermined second window threshold value with a count value obtained by counting the pwb signal in units of system clocks, outputs a level '1' in response to the count value being equal to or greater than the predetermined second window threshold value, and outputs a level '0' otherwise; and a second AND operation unit which performs an AND operation on an output of the second comparator and an inversion value of the pwb signal, and outputs the AND operation result.

8. The apparatus of claim 7, further comprising a controller which arbitrarily sets or changes the predetermined second window threshold value, or the count value of a cycle of the pwb signal.

9. The apparatus of claim 3, wherein the left window signal generator comprises:

a second comparator which compares a predetermined second window threshold value with a count value obtained by counting the pwb signal in units of system clocks, outputs a level '1' in response to the count value being equal to or greater than the predetermined second window threshold value, and outputs a level '0' otherwise; and a second AND operation unit which performs an AND operation on an output of the second comparator and an inversion value of the pwb signal, and outputs the AND operation result.

10. The apparatus of claim 9, wherein the predetermined second window threshold value is determined in consideration of a width of the window signal.

11. The apparatus of claim 1, wherein the control operation unit comprises:

a delay unit which delays the rwb signal and the pwb signal for a predetermined time until the error in the rwb signal is detected and corrected;

a lock signal generator which checks whether a phase locked loop (PLL) that is used to generate the pwb signal, operates normally;

a selection signal generator which receives a signal indicating whether the PLL is locked from the lock signal generator, checks a presence of a rising edge of the rwb signal in the window signal based on the signal, and generates a control value to correct the error; and a wobble signal selector which selects one of the input rwb signal and the pwb signal in response to the control value output from the selection signal generator.

12. The apparatus of claim 11, wherein the control operation unit further comprises a deglitch circuit which removes a glitch from the rwb signal and outputs the deglitched rwb signal to the delay unit.

13. The apparatus of claim 11, wherein the lock signal generator outputs a signal indicating a locking of the PLL where the rising edge of the rwb signal is detected in the window signal more than a predetermined number of times in a row, and outputs a signal indicating an unlocking of the PLL where the rising edge of the rwb signal is not detected more than the predetermined number of times in a row.

14. The apparatus of claim 11, wherein the selection signal generator outputs:

a first control value to select the rwb signal where a signal, which indicates that the PLL is unlocked, is output from the lock signal generator, a second control value to select the pwb signal where the PLL is locked, but not locked in the window signal, the first control value where the PLL is locked in the window signal and the rising edge of the rwb signal is detected in the window signal, and the second control value where the PLL is locked in the window signal, but the rising edge of the rwb signal is not detected in the window signal.

15. The apparatus of claim 14, wherein the wobble signal selector outputs the rwb signal where the first control value is output from the selection signal generator, and outputs the pwb signal where the second control value is output from the selection signal generator.

16. The apparatus of claim 1, wherein the control operation unit corrects the error in the rwb signal using the window signal during a detection of the wobble signal.

17. The apparatus of claim 1, wherein the control operation unit checks whether the error is contained in the rwb signal using the window signal, corrects the rwb signal at a corresponding instant of time of which the error is detected, and outputs the corrected rwb signal.

18. The apparatus of claim 17, wherein the control operation unit corrects the rwb signal having the error by outputting the pwb signal that is in phase with the rwb signal and does not contain an error, as the corrected rwb signal.

19. The apparatus of claim 1, wherein the window signal of a predetermined width is formed around a rising edge of the pwb signal so as to use the window signal to detect the error in the wobble signal.

20. A method of correcting an error in a wobble signal of a recording medium, the method comprising:

generating a window using a phase locked wobble signal (pwb) of the recording medium, wherein the pwb signal is generated in synchronization with a raw wobble signal (rwb) and the rwb signal is obtained by binarizing the wobble signal of the recording medium; and correcting an error in the rwb signal in response to the error in the rwb signal being detected in the window.

21. The method of claim 20, wherein the generating of the window includes generating the window having a predetermined width at right and left sides of a rising edge of the pwb signal, so as to use the window signal to detect the error in the wobble signal.

22. The method of claim 20, wherein the correcting of the error in the rwb signal includes:

determining if the error is present using the window signal; and correcting the rwb signal at a corresponding instant of time of which the error is detected and outputting the corrected rwb signal.

23. The method of claim 22, wherein the correcting of the rwb signal having the error comprises outputting the pwb signal that is in phase with the rwb signal and does not contain an error, as the corrected rwb signal.

24. The method of claim 20, wherein the correcting of the error in the rwb signal includes:

delaying the rwb and pwb signals for a predetermined number of times until the error in the rwb signal is detected and corrected;

determining whether a phase locked loop (PLL) that is used to generate the pwb signal is locked and generating a signal thereof;

determining whether a rising edge of the rwb signal is detected in the window, based on the signal, and generating a control value signal thereof to correct the error; and selecting one of the rwb signal and the pwb signal according to the control value signal.

* * * * *